United States Patent
Afsahi (10) Patent No.: US 7,821,339 B1
(45) Date of Patent: Oct. 26, 2010

(54) COMPOSITE DIFFERENTIAL RF POWER AMPLIFIER LAYOUT

(75) Inventor: Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/430,654

(22) Filed: Apr. 27, 2009

(51) Int. Cl.
*H03F 3/45* (2006.01)

(52) U.S. Cl. .................................. 330/253; 330/261

(58) Field of Classification Search ............... 330/253, 330/261, 295, 311
See application file for complete search history.

(56) References Cited

U.S. PATENT DOCUMENTS 5,578,964 A * 11/1996 Kim et al. .................. 330/253
6,052,025 A * 4/2000 Chang et al. ............... 330/253
7,656,230 B2 * 2/2010 Fagg ......................... 330/253

* cited by examiner

*Primary Examiner*—Henry K Choe
(74) *Attorney, Agent, or Firm*—Garlick Harrison & Markison; Bruce E. Garlick (57) ABSTRACT

A composite differential Radio Frequency (RF) power amplifier includes a plurality of differential RF cascode power amplifiers coupled in parallel. Each differential RF cascode power amplifier includes a positive transconductance stage and a positive cascode stage coupled in series with the positive transconductance stage between a voltage node and ground. Each also includes a negative transconductance stage and a negative cascode stage coupled in series with the negative transconductance stage between the voltage node and ground. The plurality of parallel differential RF cascode power amplifiers resides adjacent one another in a single semiconductor substrate such that the positive transconductance stage of a first differential RF cascode power amplifier resides adjacent a negative transconductance stage of a second differential RF cascode power amplifier and the positive cascode stage of the first differential RF cascode power amplifier resides adjacent a negative cascode stage of a second differential RF cascode power amplifier.

21 Claims, 7 Drawing Sheets

COMPOSITE DIFFERENTIAL RF POWER AMPLIFIER LAYOUT

BACKGROUND

1. Technical Field

This invention relates generally to bias voltage generation and more particularly to Radio Frequency power amplifiers used in transmitters of wireless devices within wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11x, Bluetooth, wireless wide area networks (e.g., WiMAX), advanced mobile phone services (AMPS), digital AMPS, global system for mobile communications (GSM), North American code division multiple access (CDMA), Wideband CDMA, local multi-point distribution systems (LMDS), multi-channel-multi-point distribution systems (MMDS), radio frequency identification (RFID), Enhanced Data rates for GSM Evolution (EDGE), General Packet Radio Service (GPRS), and many others.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations, and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard. As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In wireless communication devices, the power amplifier is often required to provide a high swing at its output. The power amplifier must also be very linear in its operation and also use as little power as possible. These competing goals are very difficult to meet, particularly in portable devices that are battery powered and that operate at relatively low voltages.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

Figure 1:
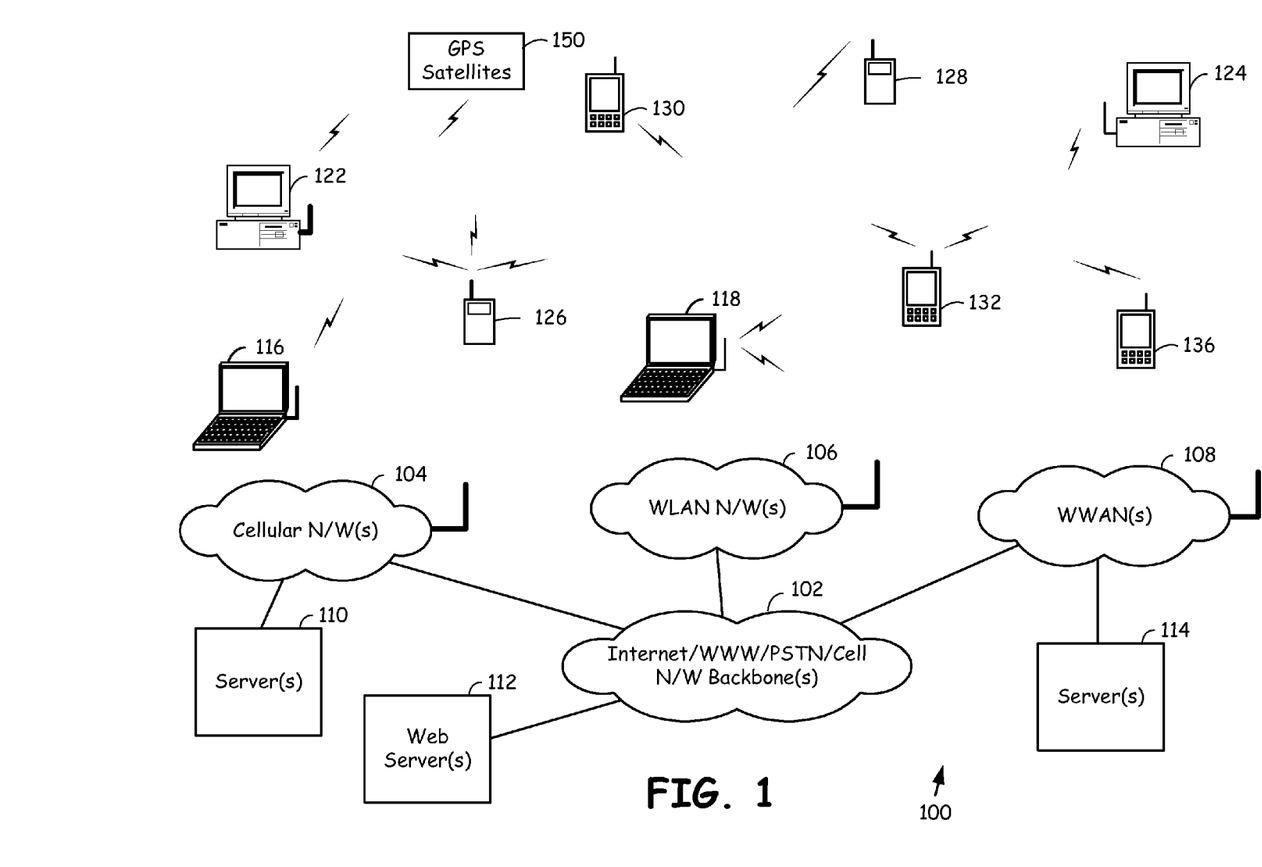
FIG. 1 is a system diagram illustrating a wireless communication system constructed and operating according to one or more embodiments of the present invention.

FIG. 1 is a system diagram illustrating a wireless communication system constructed and operating according to one or more embodiments of the present invention. The wireless communication system 100 of FIG. 1 includes a communication infrastructure and a plurality of wireless devices. The communication infrastructure includes one or more cellular networks 104, one or more wireless local area networks (WLANs) 106, and one or more wireless wide area networks (WWANs) 108. The cellular networks 104, WLANs 106, WWANs 108 all typically couple to one or more backbone networks. The backbone networks 102 may include the Internet, the Worldwide Web, one or more public switched telephone network backbones, one or more cellular network backbones, one or more private network backbones and/or other types of backbones that support communications with the various wireless network infrastructures 104, 106, and 108. Server computers may couple to these various network infrastructures. For example, server computer 110 couples to cellular network 104, web server 112 couples to the Internet/WWW/PSTN/Cell network 102, and server 114 couples to WWAN network 108. Other devices may couple to these networks as well in various other constructs.

Each of the cellular networks 104, WLANs 106, and WWANs 108 support wireless communications with wireless devices in various wireless spectra and according to various communication protocol standards. For example, the cellular network 104 may support wireless communications with wireless devices within the 800 MHz band and the 1800 MHz band, and/or other Radio Frequency (RF) bands that are allocated for cellular network communications. The cellular network 104 may support GSM, EDGE, GPRS, 3G, CDMA, TDMA, and/or various other standardized communications. Of course, these are examples only and should not be considered to limit the spectra or operations used by such cellular networks. The WLANs 106 typically operate within the Industrial, Scientific, and Medical (ISM) bands that include the 1.4 GHz and 5.8 GHz bands. The ISM bands include other frequencies as well that support other types of wireless communications, such bands including the 6.78 MHz, 13.56 MHz, 17.12 MHz, 40.68 MHz, 433.92 MHz, 915 MHz, 14.125 GHz, 61.25 GHz, 122.5 GHz, and 145 GHz bands. The WWANs networks 108 may operate within differing RF spectra based upon that which is allocated at any particular locale. Device to device communications may be serviced in one of these frequency bands as well.

The wireless network infrastructures 104, 106, and 108 support communications to and from wireless devices 116, 118, 122, 124, 126, 128, 130, 132, and/or 136. Various types of wireless devices are illustrated. These wireless devices include laptop computers 116 and 118, desktop computers 122 and 124, cellular telephones 126 and 128, portable beta terminals 130, 132, and 136. Of course, differing types of devices may be considered wireless devices within the context of the scope of the present invention. For example, automobiles themselves having cellular interfaces would be considered wireless devices according to the present invention. Further, any device having a wireless communications interface either bi-directional or uni-directional, may be considered a wireless device according to the present invention, in various other types of wireless devices. For example, wireless devices may include Global Positioning System (GPS) receiving capability to receive positioning signals from multiple GPS satellites 150.

The wireless devices 116-136 may support peer-to-peer communications as well, such peer-to-peer communications not requiring the support of a wireless network infrastructure. For example, these devices may communicate with each other in a 60 GHz spectrum, may use a peer-to-peer communications within a WLAN spectrum, for example, or may use other types of peer-to-peer communications. For example, within the ISM spectra, wireless devices may communicate according to Bluetooth protocol or any of the various available WLAN protocols supported by IEEE802.11x, for example.

As will be further described with reference to FIGS. 2-7, each of the wireless devices 116-136 illustrated in FIG. 1 includes baseband processing circuitry, Radio Frequency (RF) transceiver, and at least one antenna. According to the present invention, the RF transceiver includes an RF power amplifier with a composite structure having improved operational characteristics, including reduced parasitic losses.

Figure 2:
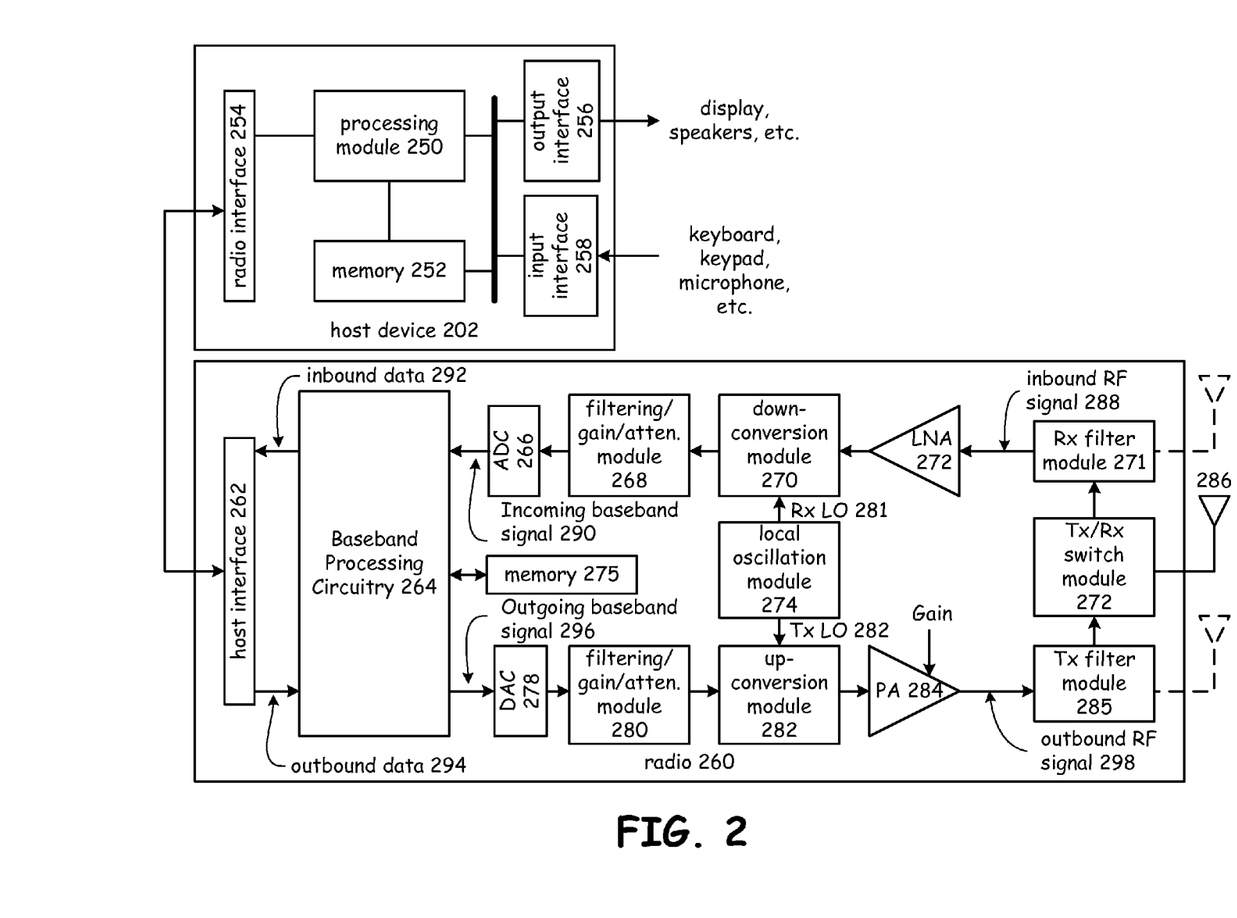
FIG. 2 is a schematic block diagram illustrating a wireless communication device that includes a host device and an associated radio.

FIG. 2 is a schematic block diagram illustrating a wireless communication device that includes a host device and an associated radio. For cellular telephone hosts, the radio 260 is a built-in component. For personal digital assistants hosts, laptop hosts, and/or personal computer hosts, the radio 260 may be built-in or may be an externally coupled component that couples to the host device 202 via a communication link, e.g., PCI interface, PCMCIA interface, USB interface, or another type of interface.

As illustrated, the host device 202 includes a processing module 250, memory 252, radio interface 254, input interface 258, and output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera via the input interface 258 or generate the data itself. For data received via the input interface 258, the processing module 250 may perform a corresponding host function on the data and/or route it to the radio 260 via the radio interface 254.

Radio 260 includes a host interface 262, baseband processing circuitry/baseband processing module 264, an analog-to-digital converter (ADC) 266, a filtering/gain/attenuation module 268, an IF mixing down conversion stage 270, a receiver filter 271, a low noise amplifier (LNA) 272, a transmitter/receiver switch 273, a local oscillation module 274, memory 275, a digital-to-analog converter (DAC) 278, a filtering/gain/attenuation module 280, an IF mixing up conversion stage 282, a power amplifier (PA) 284, a transmitter filter module 285, and one or more antennas 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device is compliant and the particular design of the device.

The baseband processing circuitry 264, in combination with operational instructions stored in memory 275, executes digital receiver functions and digital transmitter functions. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The baseband processing circuitry 264 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing circuitry 264 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 275 stores, and the baseband processing circuitry 264 executes, operational instructions that facilitate functionality of the device.

In operation, the radio 260 receives outbound data 294 from the host device via the host interface 262. The host interface 262 routes the outbound data 294 to the baseband processing circuitry 264, which processes the outbound data 294 in accordance with a particular wireless communication standard (e.g., Cellular, WiMAX, IEEE802.11a, IEEE802.11b, IEEE802.11g, IEEE802.11n, Bluetooth, et cetera) to produce digital transmission formatted data/outgoing baseband signal 296. The digital transmission formatted data 296 will be a digital base-band signal or a digital low IF signal, where the low IF typically will be in the frequency range of one hundred kilohertz to a few megahertz.

The digital-to-analog converter 278 converts the digital transmission formatted data 296 from the digital domain to the analog domain. The filtering/gain/attenuation module 280 filters and/or adjusts the gain of the analog signal prior to providing it to the IF mixing stage 282. The IF mixing stage 282 directly or via multiple conversion steps (super heterodyne) converts the analog baseband or low IF signal into an RF signal based on a transmitter local oscillation 283 provided by local oscillation module 274. The power amplifier (PA) 284 amplifies the RF signal to produce outbound RF signal 298, which is filtered by the transmitter filter module 285. The antenna 286 transmits the outbound RF signal 298 to a targeted device such as a base station, an access point, and/or another wireless communication device.

The radio 260 also receives an inbound RF signal 288 via the antenna 286, which was transmitted by a base station, an access point, or another wireless communication device. The antenna 286 provides the inbound RF signal 288 to the receiver filter module 271 via the Tx/Rx switch 273, where the Rx filter 271 band pass filters the inbound RF signal 288. The Rx filter 271 provides the filtered RF signal to low noise amplifier (LNA) 272, which amplifies the signal 288 to produce an amplified inbound RF signal. The low noise amplifier 272 provides the amplified inbound RF signal to the IF mixing module 270, which directly converts the amplified inbound RF signal into an inbound low IF signal or baseband signal based on a receiver local oscillation 281 provided by local oscillation module 274. The down conversion module 270 provides the inbound low IF signal or baseband signal to the filtering/gain/attenuation module 268. The filtering/gain/attenuation module 268 may be implemented in accordance with the teachings of the present invention to filter and/or attenuate the inbound low IF signal or the inbound baseband signal to produce a filtered inbound signal.

The analog-to-digital converter 266 converts the filtered inbound signal from the analog domain to the digital domain to produce digital reception formatted data/incoming baseband signal 290. The baseband processing circuitry 264 decodes, descrambles, demaps, and/or demodulates the digital reception formatted data 290 to recapture inbound data 292 in accordance with the particular wireless communication standard being implemented by radio 260. The host interface 262 provides the recaptured inbound data 292 to the host device 28-32 via the radio interface 254.

As one of average skill in the art will appreciate, the wireless communication device of FIG. 2 may be implemented using one or more integrated circuits. For example, the host device may be implemented on one integrated circuit, the baseband processing circuitry 264, and memory 275 may be implemented on a second integrated circuit, and the remaining components of the radio 260, less the antenna(s) 286, may be implemented on a third integrated circuit. As an alternate example, the radio 260 may be implemented on a single integrated circuit. As yet another example, the processing module 250 of the host device and the baseband processing circuitry 264 may be a common processing device implemented on a single integrated circuit. Further, the memory 252 and memory 275 may be implemented on a single integrated circuit and/or on the same integrated circuit as the common processing modules of processing module 250 and the baseband processing circuitry 264.

According to aspects of the present invention, the PA 284 (RF power amplifier) RF power amplifier with a composite structure. Various embodiments of the RF power amplifier will be described further herein with reference to FIGS. 4-7.

Figure 3:
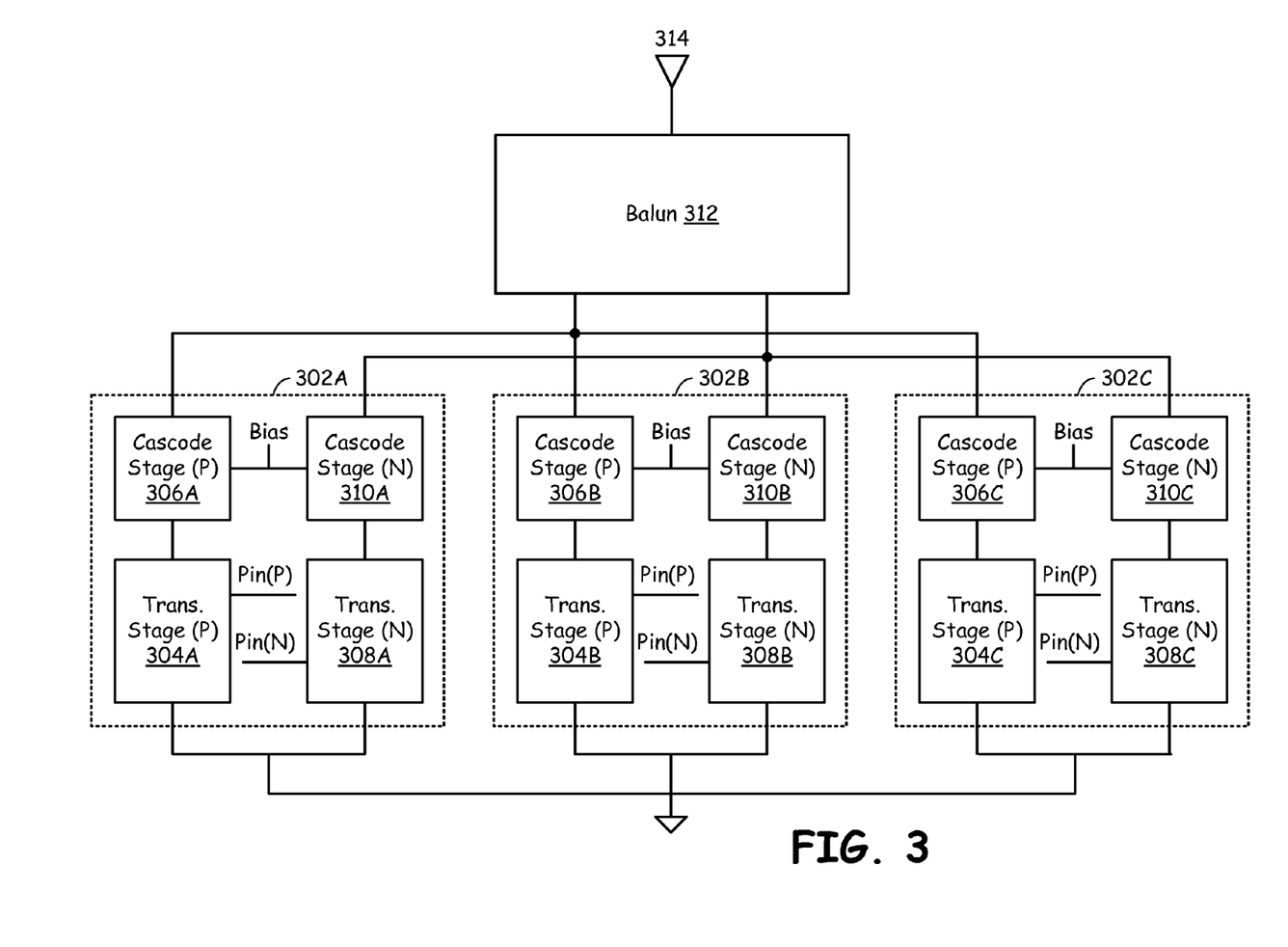
FIG. 3 is a block diagram illustrating a composite differential RF power amplifier constructed according to one or more embodiments of the present invention.

FIG. 3 is a block diagram illustrating a composite differential RF power amplifier constructed according to one or more embodiments of the present invention. The differential RF power amplifier 300 includes a plurality of differential RF cascode power amplifiers 302A, 302B, and 302C coupled in parallel. Each of the plurality of differential RF cascode power amplifiers 302A, 302B, and 302C includes a positive transconductance stage, a positive cascode stage, a negative transconductance stage, and a negative cascode stage. A first differential RF cascode power amplifier 302A includes positive transconductance stage 304A, positive cascode stage 306A, negative transconductance stage 308A, and negative cascode stage 310A. The positive transconductance stage 308A and the negative transconductance stage 308 receive first and second (positive and negative) differential RF signal inputs. The positive cascode stage 306A is coupled in series with the positive transconductance stage 304A between a voltage node and ground. The positive cascode stage has a first differential RF signal output and at least one bias input to at least one cascode transistor. The negative cascode stage 310A has at least one cascode transistor and is coupled in series with the negative transconductance stage 308A between the voltage node and ground. The negative cascode stage 310A has a second differential RF signal output and at least one bias input coupled to the at least one cascode transistor.

Likewise, differential RF cascode power amplifier 302B includes positive transconductance stage 304B, positive cascode stage 306A, negative transconductance stage 308B, and negative cascode stage 310B. The positive transconductance stage 304B receives a first differential RF signal input while the negative transconductance stage 308B receives the second differential RF signal input. Further, the positive cascode stage 306B receives a bias input and includes at least one cascode transistor and the negative cascode stage 310B includes at least one cascode transistor that receives at least one bias voltage input. The positive cascode stage 306B and the negative cascode stage 310B of the differential RF cascode power amplifier 302B have differential RF signal outputs.

Differential RF cascode power amplifier 302C includes positive transconductance stage 304C, positive cascode stage 306C, negative transconductance stage 308C, and negative cascode stage 310C. The positive transconductance stage 304C and negative transconductance stage 308C receive first and second differential RF signal inputs, respectively. The positive cascode stage 306C and negative cascode stage 310C receive at least one bias voltage and produce first and second RF signal outputs, respectively.

BALanced-Unbalanced transformer (Balun) 312 receives composite differential RF signal inputs from the differential RF cascode power amplifiers 302A, 302B, and 302C via coupling circuitry. As is generally known, the Balun 312 receives the differential signal input and produces a singled ended RF signal output, to antenna 314 in the embodiment of FIG. 3 for transmission. With other embodiments of the present invention, structure that couples the plurality of differential RF cascode power amplifiers 302A, 302B, and 302C to the antenna 314 may be employed. For example, a plurality of intercoupled inductors could be employed to couple the outputs of the plurality of differential RF cascode power amplifiers 302A, 302B, and 302C to the antenna 314. Further, while baluns are illustrated FIGS. 5, 6, and 7 as coupling structures, differing coupling structures could be used with those embodiments as well.

According to various aspects of the present invention, the plurality of differential RF cascode power amplifiers 302A, 302B, and 302C reside adjacent one another in a single semiconductor substraight. With this configuration, the positive transconductance stage 304B of second differential RF cascode power amplifier 302B resides adjacent negative transconductance stage 308A of first differential RF cascode power amplifier 302A Likewise, the positive cascode stage 306B of the second differential RF cascode power amplifier 302B resides adjacent negative cascode stage 310A of the first differential RF cascode power amplifier 302A. Of course, the referencing between first and second of the differential RF cascode power amplifiers 302A and 302B could be translated. In any case, the positive portions of one of the differential RF cascode power amplifiers 302B and/or 302C resides adjacent the negative portions of the adjacent RF cascode power amplifier 302A and/or 302B, respectively.

Likewise, negative transconductance stage 308B and negative cascode stage 310B of differential RF cascode power amplifiers 302B resides adjacent positive transconductance stage 304C and positive cascode stage 306C of differential RF cascode power amplifier 302C. With the positive and negative portions of differential RF cascode power amplifiers adjacent neighboring portions of differing differential RF cascode power amplifiers, the parasitic effects between adjacent differential RF cascode power amplifiers are reduced. By reducing the parasitic effects of adjacent differential RF cascode power amplifiers, the composite differential RF power amplifier is more efficient from a power consumption standpoint considering the power output of the composite structure.

Figure 4:
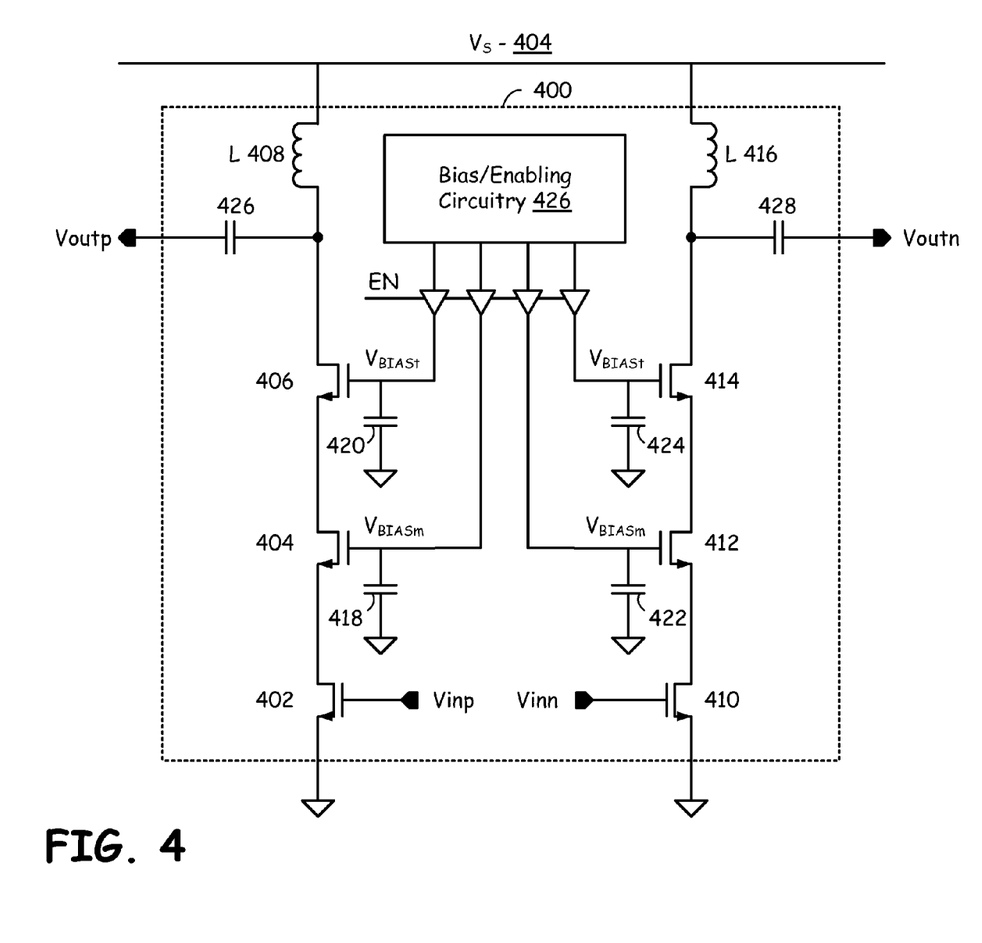
FIG. 4 is a circuit diagram illustrating a differential RF cascode power amplifier constructed according to one or more embodiments of the present invention.

FIG. 4 is a circuit diagram illustrating a differential RF cascode power amplifier constructed according to one or more embodiments of the present invention. The differential RF cascode power amplifier 400 couples between a voltage node 404 and ground. A positive transconductance stage of the differential RF cascode power amplifier 400 includes transconductance device 402 that receives the first differential RF signal. The positive cascode stage of the differential RF cascode power amplifier includes cascode transistors 404 and 406. These transcode transistors 404 and 406 may be thick film devices as compared to transconductance transistor 402. The cascode transistors 404 and 406 receive bias voltage signals $V_{BIASm}$ and $V_{BIASt}$ at their gates, respectively. Capacitors 418 and 420 filter out high frequency components of bias signals $V_{BIASm}$ and $V_{BIASt}$. The positive portion of the differential RF cascode power amplifier 400 includes inductor 408 and capacitor 426 that enable production of the first differential RF signal output Voutp. In other embodiments, differing configurations of lumped elements that block AC and pass AC signal components may be employed.

A negative portion of the differential RF cascode power amplifier 400 includes transconductance transistor 410 that forms the negative transconductance stage of the differential RF cascode power amplifier 400. The negative cascode stage of the differential RF cascode power amplifier includes cascode transistors 412 and 414 that receive bias signals $V_{BIASm}$ and $V_{BIASt}$, respectively. These may be the same or differing bias signals that are received by the positive portion of the differential RF cascode power amplifier. Capacitors 422 and 424 filter high frequency components from bias signals $V_{BIASm}$ and $V_{BIAS+}$. Inductor 416 and capacitor 428 support production of the second differential RF signal output of the negative portion of the differential RF cascode power amplifier 400.

The differential RF cascode power amplifier 400 may further include biasing circuitry 426 that is operable to produce the bias voltages $V_{BIASm}$ and $V_{BIAS+}$ to the positive and negative cascode stages. With structures that differ from that of FIG. 3 that include additional cascode transistors, biasing circuitry 426 may provide additional bias voltages. The biasing circuitry 426 may further include enabling circuitry that is operable to selectably enable the plurality of differential RF cascode power amplifiers to adjust the gain of the composite differential RF power amplifier and/or to save power during idle periods. Enabling circuitry 426 selectively applies either enabling bias inputs to the cascode transistors 404, 406, 412, and 414 or disabling bias inputs to the transistors. The enabling circuitry may also include a plurality of drivers each operable to selectively enable the positive and negative cascode transistors 404, 406, 412, and 414 of the differential RF cascode power amplifier 400.

While the embodiment of FIG. 4 illustrates a differential RF power amplifier having two cascode transistors in each single ended leg, differing embodiments could have fewer or more cascode transistors in each leg. For example, another differential RF power amplifier could have a single cascode transistor in each leg or more than two cascode transistors in each leg. Further, other RF amplification circuits that are constructed according to the present invention could take different, non-cascode structures, without departing from the teachings and scope of the present invention.

Figure 5:
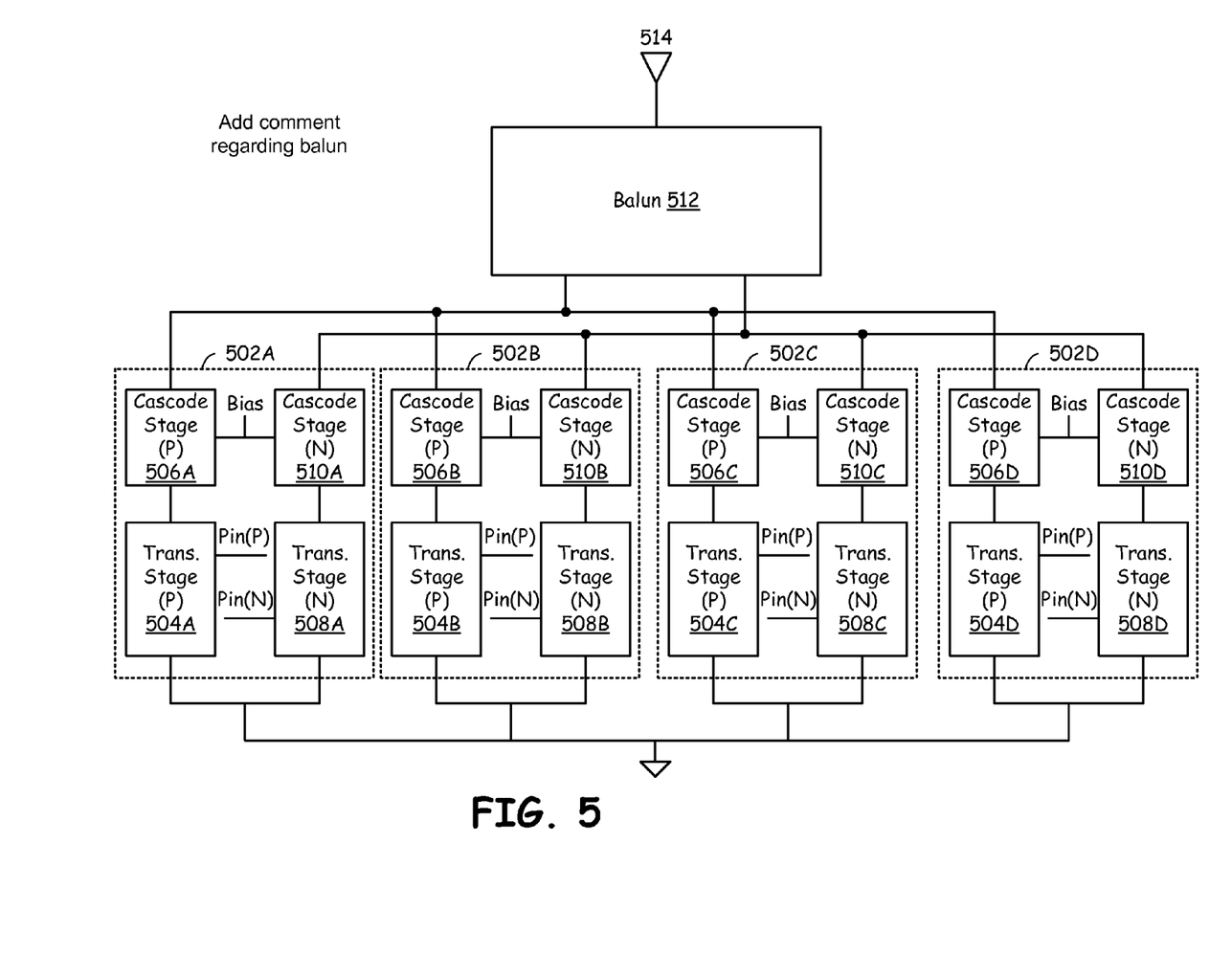
FIG. 5 is a block diagram illustrating another composite differential RF power amplifier constructed according to one or more embodiments of the present invention.

FIG. 5 is a block diagram illustrating another composite differential RF power amplifier constructed according to one or more embodiments of the present invention. With the embodiment of FIG. 5, the differential RF power amplifier includes a plurality of differential RF cascode power amplifiers 502A, 502B, 502C, and 502D. A first differential RF cascode power amplifier 502A includes a positive transconductance stage 504A, a positive cascode stage 506A, a negative transconductance stage 508A, and a negative cascode stage 510A. Likewise, second differential RF cascode power amplifier 502B includes positive transconductance stage 504B, positive cascode stage 506B, negative transconductance stage 508B, and negative cascode stage 510B. Further, a third differential RF cascode power amplifier 502C includes positive transconductance stage 504C, positive cascode stage 506C, negative transconductance stage 508C, and negative cascode stage 510C. Finally, fourth differential RF cascode power amplifier 502D includes positive transconductance stage 504D, positive cascode stage 506D, negative transconductance stage 508D, and negative cascode stage 510D. The plurality of differential RF cascode power amplifiers 502A, 502B, 502C, and 502D couples in parallel to balun 512. The balun 512 receives the differential RF composite signal and produces a single-ended output to antenna 514.

The negative transconductance stage 508A and negative cascode stage 510A of differential RF cascode power amplifier 502A resides adjacent positive transconductance stage 504B and positive cascode stage 506B of differential RF cascode power amplifier 502B, respectively. Likewise, negative transconductance stage 508B and negative cascode stage 510B reside adjacent positive transconductance stage 504C and positive cascode stage 506C of differential RF cascode power amplifier 502C, respectively. Finally, negative transconductance stage 508C, and negative cascode stage 510C of differential RF cascode power amplifier 502C reside adjacent positive transconductance stage 504D and positive cascode stage 506D of differential power amplifier 502D, respectively.

The structure of FIG. 5 may include bias circuitry and/or enabling circuitry previously described with reference to FIG. 4. Such biasing circuitry may be a single bias circuit that provides bias voltages to each of cascode stages of differential RF power amplifiers 502A, 502B, 502C, and/or 502D. The enabling circuitry could include a plurality of switches that switch in-and-out the various differential RF power amplifiers 502A, 502B, 502C, and 502D. An example of such switching structure will be described further herein with reference to FIG. 7.

With each of the structures of FIGS. 3, 4 and 5, various cascode stages could include at least one laterally diffused metal oxide silicon (LDMOS) transistor. LDMOS transistors have a relatively high breakdown voltage but with good performance for cascode devices in such structures. Thus, by using LDMOS transistors in one or more of the cascode stages, differential RF power amplifiers could be used with relatively higher source voltages to produce relatively better performing amplification.

Figure 6:
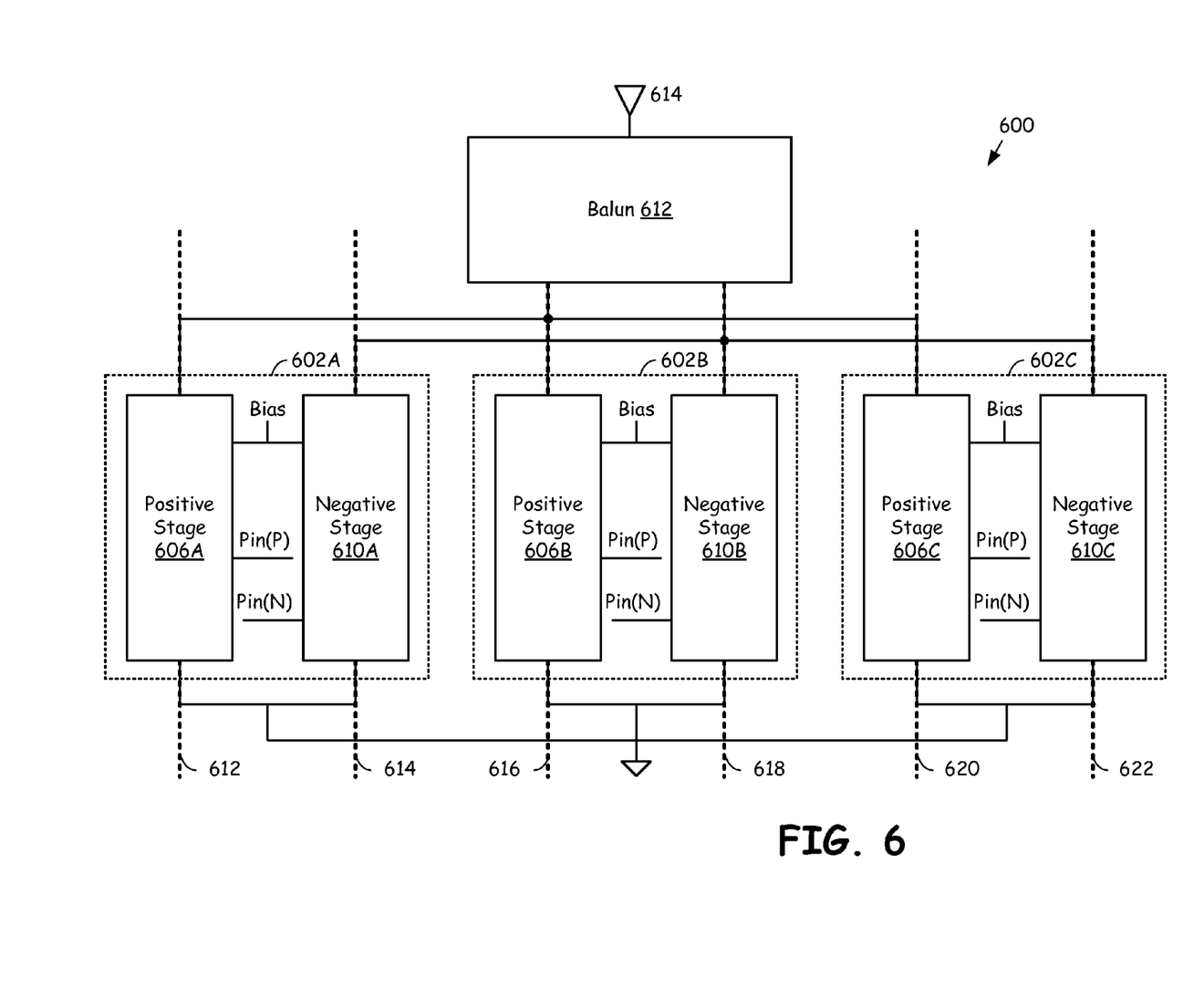
FIG. 6 is a block diagram illustrating yet another composite differential RF power amplifier constructed according to one or more embodiments of the present invention.

FIG. 6 is a block diagram illustrating yet another composite differential RF power amplifier constructed according to one or more embodiments of the present invention. The composite differential RF power amplifier 600 includes a plurality of differential RF cascode power amplifiers 602A, 602B, and 602C coupled in parallel. Each of these differential RF power amplifiers includes a positive stage and a negative stage. For example, differential RF power amplifier 602A includes positive stage 606A and negative stage 610A. The positive stage receives a positive RF differential input and the negative stage 610A receives a negative RF differential input. The positive stage 606A and the negative 610A may be biased with a bias voltage input.

Likewise, second differential RF power amplifier 602B includes a positive stage 606B and a negative stage 610B. The positive stage 606B and negative stage 610B receive positive RF input signals and negative RF input signals, respectively. Finally, a third differential RF power amplifier 602C includes a positive stage 606C and a negative stage 610C. The positive stage 606C receives a positive RF differential input and negative stage 610C receives a second differential RF input. As was the case with the first differential RF power amplifier 602A, each of the second and third differential RF power amplifiers 602B and 602C may be biased with respective bias voltages. The plurality of differential RF power amplifiers 602A, 602B, and 602C are coupled in parallel such that their RF signal outputs are additive. Further, the composite differential RF power amplifier 600 is constructed such that the negative stage of one of the differential RF power amplifiers resides adjacent a positive stage of an adjacent RF differential RF power amplifier. In such case, the negative stage 610A of differential RF power amplifier 602A resides adjacent positive stage 606B of differential RF power amplifier 602B Likewise, the negative stage 610B of differential RF power amplifier 602B resides adjacent positive stage 606C of differential RF power amplifier 602C.

The composite differential RF power amplifier 600 of FIG. 6 couples the outputs of the differential RF power amplifier 602A, 602B, and 602C in parallel to balun 612. The balun 612 converts the incoming differential RF signals to produce a single-ended signal for antenna 614.

According to an aspect of the present invention illustrated in FIG. 6 (as well as in FIGS. 3 and 5) the positive and negative portions of the various RF power amplifiers may be constructed with particular orientation. In such case, the positive stage 606A of differential RF power amplifier 602A resides along a first orientation line 602. Further, the negative stage 610A of the differential RF power amplifier 602A resides along a second orientation line 614 that is substantially parallel to the first orientation line 612. Likewise, the positive stage 606B of differential RF power amplifier 602B resides along a third orientation line 616 that is substantially parallel to the first orientation line 612. Moreover, the negative stage 610B of the differential RF power amplifier 602B resides along a fourth orientation line 618 that is substantially parallel to the first orientation line 612. This construct may be further related to differential RF power amplifier 602C positive stage 606C residing along orientation line 620, which is substantially parallel to the first orientation line 612. Further, positive stage 606C resides along orientation line 602 and negative stage 610C resides along orientation line 622, both of which are substantially parallel to the first orientation line 612.

The orientation of the positive and negative stages of the composite differential RF power amplifiers of the embodiment of FIG. 6 may be further applied to the structures of FIGS. 3, 4, and 5 and the structure that will subsequently described with reference to FIG. 7.

Figure 7:
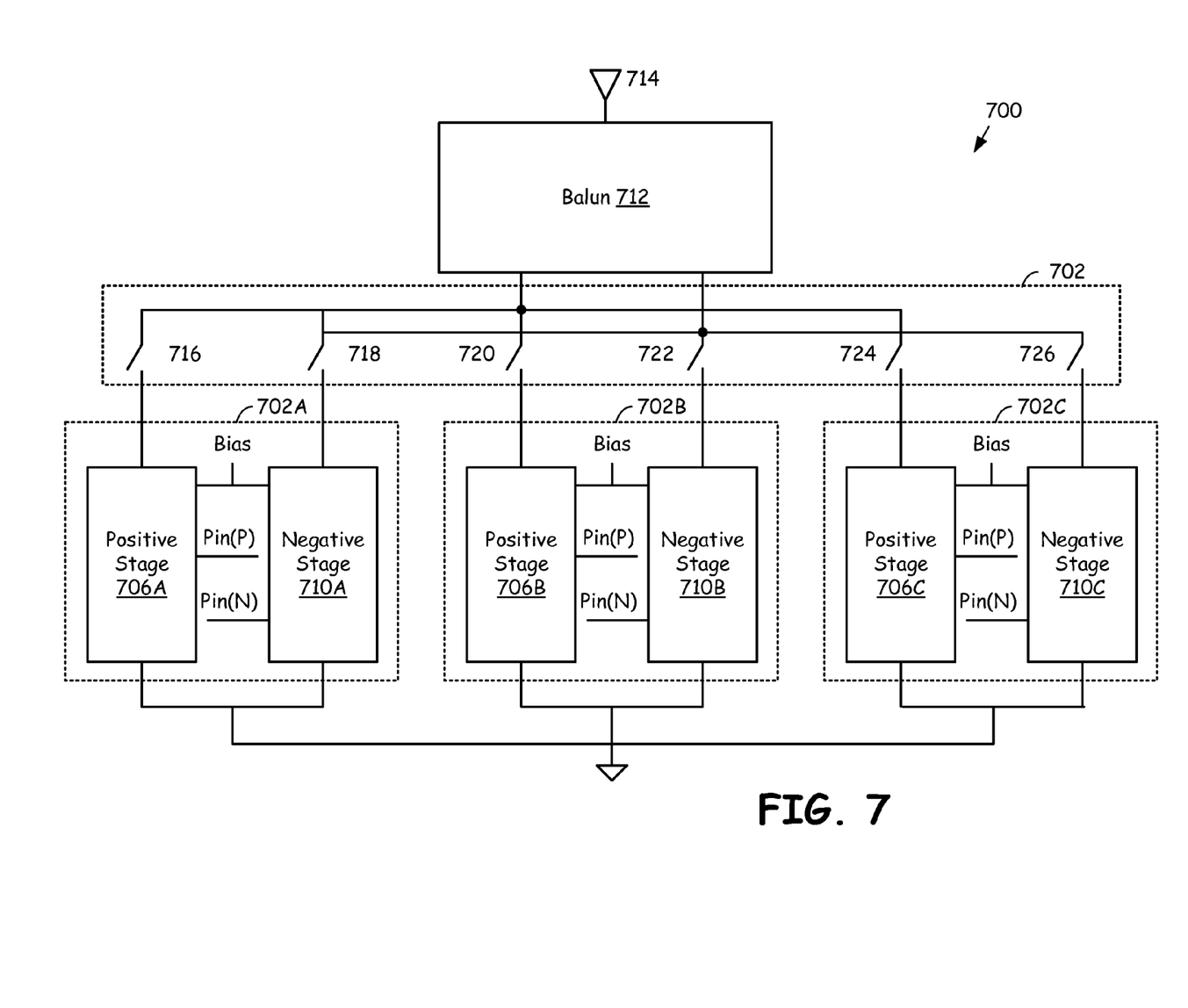
FIG. 7 is a block diagram illustrating a composite differential RF power amplifier constructed according to one or more embodiments of the present invention.

FIG. 7 is a block diagram illustrating a composite differential RF power amplifier constructed according to one or more embodiments of the present invention. The composite differential RF power amplifier 700 includes a plurality of differential RF cascode power amplifier 702A, 702B, and 702C. Differential RF cascode power amplifier 702A includes positive stage 706A, and negative stage 710A. Differential RF cascode power amplifier 702B includes positive stage 706B and negative stage 710B. Differential RF cascode power amplifier 702C includes positive stage 706C and negative stage 710C. The structure and operations of these differential RF cascode power amplifiers 702A, 702B, and 702C was described previously herein with reference to FIGS. 3-6 and will not be described in more detail with reference to FIG. 7.

According to the structure of FIG. 7, the composite differential RF power amplifier 700 includes enabling circuitry 702 that is operable to selectably enable the various differential RF power amplifiers 702A, 702B, and 702C to a composite RF signal to balun 712 that couples the RF signal antenna 714. The enabling circuitry 702 includes a plurality of switches 716, 718, 720, 722, 724, and 726. These switches 716-726 are controllable to selectively couple the differential RF power amplifiers 702A, 702B, and 702C to the balun 712. The plurality of switches 716, 718, 720, 722, 724, and 726 are controlled by the baseband circuitry of FIG. 2, for example.

By selectively opening and closing these switches, the various differential RF power amplifiers 702A, 702B, and 702C either contribute to RF amplification or are removed fro contributing to RF amplification.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. A differential Radio Frequency (RF) power amplifier comprising:
    a plurality of differential RF cascode power amplifiers coupled in parallel, each comprising:
    a positive transconductance stage with a first differential RF signal input;
    a positive cascode stage having at least one cascode transistor, the positive cascode stage coupled in series with the positive transconductance stage between a voltage node and ground, the positive cascode stage having a first differential RF signal output and at least one bias input to the at least one cascode transistor;
    a negative transconductance stage with a second differential RF signal input; and
    a negative cascode stage having at least one cascode transistor, the negative cascode stage coupled in series with the negative transconductance stage between the voltage node and ground, the positive cascode stage having a second differential RF signal output and at least one bias input to the at least one cascode transistor; and
    the plurality of parallel differential RF cascode power amplifiers residing adjacent one another in a single semiconductor substrate such that:
    the positive transconductance stage of a first differential RF cascode power amplifier resides adjacent a negative transconductance stage of a second differential RF cascode power amplifier; and
    the positive cascode stage of the first differential RF cascode power amplifier resides adjacent a negative cascode stage of a second differential RF cascode power amplifier.

2. The composite differential RF power amplifier of claim 1, further comprising bias circuitry operable to provide bias voltages to the positive and negative cascode stages of the plurality of differential RF cascode power amplifiers.

3. The composite differential RF power amplifier of claim 1, further comprising enabling circuitry operable to selectively enable the plurality of differential RF cascode power amplifiers to adjust gain of the composite differential RF power amplifier.

4. The composite differential RF power amplifier of claim 3, wherein the enabling circuitry comprises a plurality of switches, each respective to a differential RF cascode power amplifier.

5. The composite differential RF power amplifier of claim 3, wherein the enabling circuitry comprises drivers operable to selectively enable the positive and negative cascode transistors of at least one of the plurality of differential RF cascode power amplifiers.

6. The composite differential RF power amplifier of claim 1, wherein each cascode stage comprises at least one LDMOS transistor.

7. The composite differential RF power amplifier of claim 1, the plurality of differential RF cascode power amplifiers comprise at least three differential RF cascode power amplifiers, wherein:
the negative transconductance stage of the first differential RF cascode power amplifier resides adjacent a positive transconductance stage of a third differential RF cascode power amplifier; and
the negative cascode stage of the first differential RF cascode power amplifier resides adjacent a positive cascode stage of the third differential RF cascode power amplifier.

8. A composite differential Radio Frequency (RF) power amplifier comprising:
at least three differential RF power amplifiers coupled in parallel, each comprising a positive stage and a negative stage;
differential coupling circuitry that couples differential outputs of the plurality of differential RF power amplifiers; and
the plurality of parallel differential RF power amplifiers residing adjacent one another in a single semiconductor substrate such that the positive stage of a first differential RF power amplifier resides adjacent a negative stage of a second differential RF power amplifier and a negative stage of the first differential RF power amplifier resides adjacent a positive stage of a third differential RF power amplifier.

9. The composite differential RF power amplifier of claim 8, further comprising bias circuitry operable to provide bias voltages to positive and negative devices of the plurality of differential RF power amplifiers.

10. The composite differential RF power amplifier of claim 8, further comprising enabling circuitry operable to selectively enable the plurality of differential RF power amplifiers to adjust gain of the composite differential RF power amplifier.

11. The composite differential RF power amplifier of claim 10, wherein the enabling circuitry comprises a plurality of switches, each respective to a differential RF power amplifier.

12. The composite differential RF power amplifier of claim 10, wherein the enabling circuitry comprises drivers operable to selectively enable the plurality of differential RF power amplifiers.

13. The composite differential RF power amplifier of claim 8, wherein:
the positive stage of a first differential RF power amplifier resides along a first orientation line;
the negative stage of the first differential RF power amplifier resides along a second orientation line that is substantially parallel to the first orientation line;
the positive stage of a second differential RF power amplifier resides along a third orientation line that is substantially parallel to the first orientation line; and
the negative stage the second differential RF power amplifier resides along a fourth orientation line that is substantially parallel to the first orientation line.

14. A composite differential Radio Frequency (RF) power amplifier comprising:
a plurality of differential RF cascode power amplifiers coupled in parallel, each comprising:
a positive transconductance stage;
a positive cascode stage coupled in series with the positive transconductance stage between a voltage node and ground;
a negative transconductance stage; and
a negative cascode stage coupled in series with the negative transconductance stage between the voltage node and ground; and
the plurality of parallel differential RF cascode power amplifiers residing adjacent one another in a single semiconductor substrate such that:
the positive transconductance stage of a first differential RF cascode power amplifier resides adjacent a negative transconductance stage of a second differential RF cascode power amplifier; and
the positive cascode stage of the first differential RF cascode power amplifier resides adjacent a negative cascode stage of the second differential RF cascode power amplifier.

15. The composite differential RF power amplifier of claim 14, further comprising bias circuitry operable to provide bias voltages to the positive and negative cascode stages of the plurality of differential RF cascode power amplifiers.

16. The composite differential RF power amplifier of claim 14, further comprising enabling circuitry operable to selectively enable the plurality of differential RF cascode power amplifiers to adjust gain of the composite differential RF power amplifier.

17. The composite differential RF power amplifier of claim 16, wherein the enabling circuitry comprises a plurality of switches, each respective to a differential RF cascode power amplifier.

18. The composite differential RF power amplifier of claim 16, wherein the enabling circuitry comprises drivers operable to selectively enable the positive and negative cascode transistors of at least one of the plurality of differential RF cascode power amplifiers.

19. The composite differential RF power amplifier of claim 14, wherein each cascode stage comprises at least one LDMOS transistor.

20. The composite differential RF power amplifier of claim 14, the plurality of differential RF cascode power amplifiers comprise at least three differential RF cascode power amplifiers, wherein negative portions of the first RF cascode power amplifiers reside adjacent positive portions of a third RF cascode power amplifier.

21. The composite differential RF power amplifier of claim 14, wherein:
the positive transconductance stage and positive cascode stage of a first differential RF cascode power amplifier reside along a first orientation line;
the negative transconductance stage and negative cascode stage of the first differential RF cascode power amplifier reside along a second orientation line that is substantially parallel to the first orientation line;

the positive transconductance stage and positive cascode stage of a second differential RF cascode power amplifier reside along a third orientation line that is substantially parallel to the first orientation line; and the negative transconductance stage and negative cascode stage of the second differential RF cascode power amplifier reside along a fourth orientation line that is substantially parallel to the first orientation line.

* * * * *